(12) United States Patent
Plummer et al.

(10) Patent No.: US 9,008,137 B1
(45) Date of Patent: Apr. 14, 2015

(54) METHOD AND APPARATUS FOR COMPACT AND EFFICIENT INTRODUCTION OF HIGH RADIANT POWER INTO AN OPTICAL FIBER

(71) Applicants: William T. Plummer, Concord, MA (US); Aland K. Chin, Sharon, MA (US); Richard H. Chin, Somerville, MA (US); Jonah H. Jacob, Brookline, MA (US)

(72) Inventors: William T. Plummer, Concord, MA (US); Aland K. Chin, Sharon, MA (US); Richard H. Chin, Somerville, MA (US); Jonah H. Jacob, Brookline, MA (US)

(73) Assignee: Science Research Laboratory, Inc., Somerville, MA (US)

(*) Notice: Subject to any disclaimer, the term of this patent is extended or adjusted under 35 U.S.C. 154(b) by 0 days.

(21) Appl. No.: 14/242,082

(22) Filed: Apr. 1, 2014

(51) Int. Cl.
*H01S 3/04* (2006.01)
*H01S 5/024* (2006.01)

(52) U.S. Cl.
CPC .................................. *H01S 5/02423* (2013.01)

(58) Field of Classification Search
CPC ........ H01S 5/02423; H01S 3/04; H01S 3/102
USPC ............... 372/35, 36; 257/E23.089; 228/174; 165/104.33
See application file for complete search history.

(56) References Cited

U.S. PATENT DOCUMENTS

2006/0215715 A1* 9/2006 Kouta et al. ..................... 372/36
2012/0177073 A1* 7/2012 Stephens et al. ................. 372/35

OTHER PUBLICATIONS

Goodman, D. S. et al. Multi-Laser Print Head. Proc. SPIE 3430, Novel Optical Systems and Large-Aperture Imaging, 6 (Dec. 8, 1998).
Singh, R. et al. Description and applications of high-brightness multi-laser-diode system. Proc. SPIE 3945, Laser Diodes and LEDs in Industrial, Measurement, Imaging, and Sensors Applications II; Testing, Packaging, and Reliability of Semiconductor Lasers V, 32 (Mar. 29, 2000).
Sipes, Jr., D. L. et al. A Systems Approach for Designing Copact, Low Cost, High Power Fiber Amplifiers. Proc. SPIE 7686, Laser Technology for Defense and Security VI, 768618 (May 4, 2010).
Sipes, Jr., D. L. et al. KW monolithic PCF Fiber Amplifiers for narrow linewidth and single mode operation. Proc. SPIE 8381, Laser Technology for Defense and Security VIII, 83811E (May 7, 2012).
Wetter, A. Tapered fused-bundle splitter capable of 1 kW CW operation. Proc. SPIE 6453, Fiber Lasers IV: Technology, Systems, and Applications, 64530I (Feb. 20, 2007).
Yu, H. et al. 1.2-kW single-mode fiber laser based on 100-W high-brightness pump diodes. Proc. SPIE 8237, Fiber Lasers IX: Technology, Systems, and Applications, 82370G (Feb. 9, 2012).

* cited by examiner

*Primary Examiner* — Tuan Nguyen
(74) *Attorney, Agent, or Firm* — Burns & Levinson LLP; Orlando Lopez

(57) ABSTRACT

A method and apparatus transferring high radiant power from a plurality of laser diodes into a single optical fiber with high efficiency, small size, and reduced weight.

12 Claims, 8 Drawing Sheets

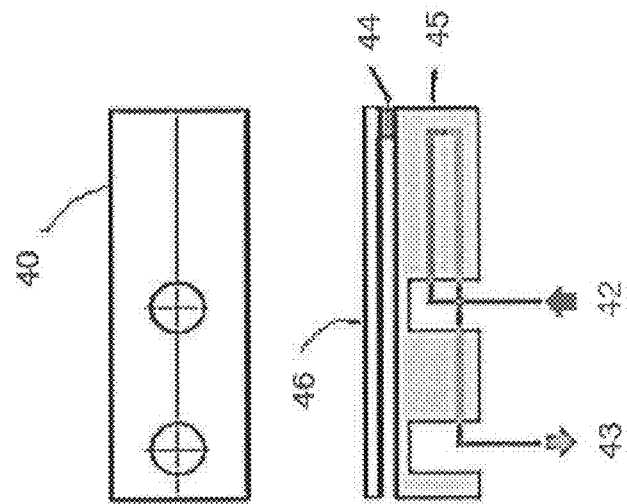
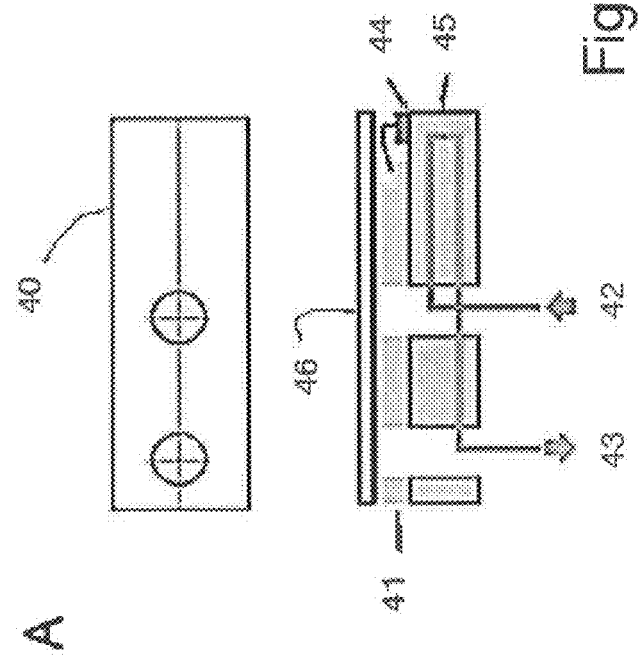
Fig. 4

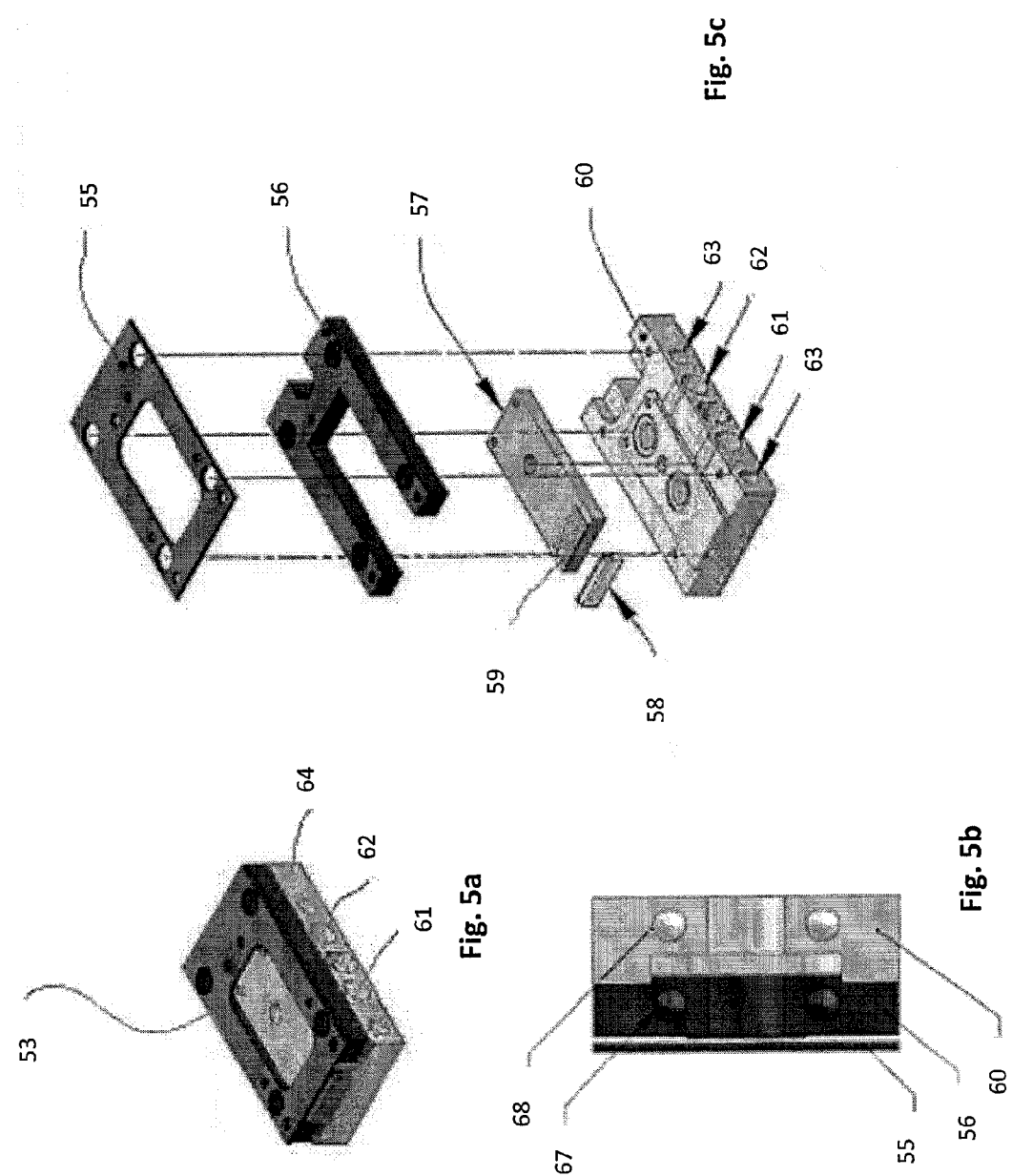

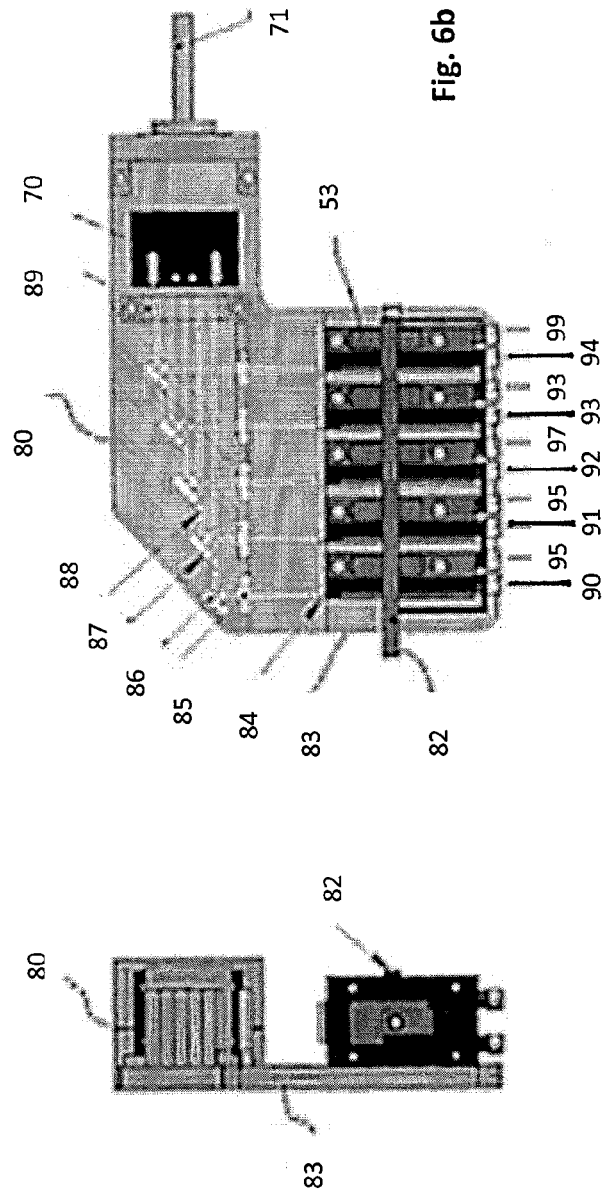
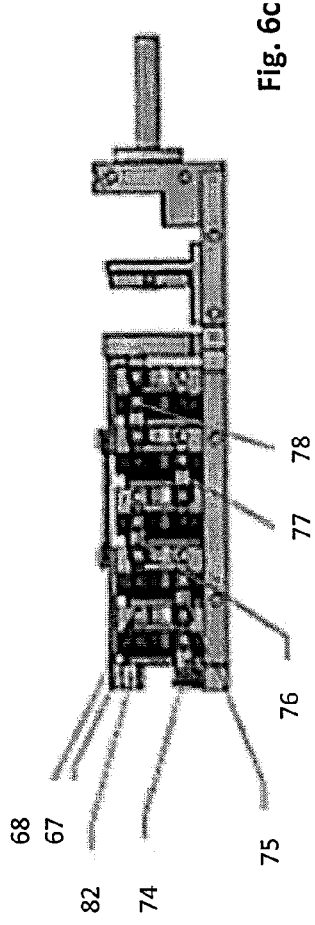

METHOD AND APPARATUS FOR COMPACT AND EFFICIENT INTRODUCTION OF HIGH RADIANT POWER INTO AN OPTICAL FIBER

BACKGROUND OF THE INVENTION

The present teachings relate in general to laser diodes. The teachings relate in particular to the combination of radiant power emitted by one or more laser diodes into a beam that can be introduced into a single optical fiber for transport or for other purposes.

Laser diodes are well known in the art as small and useful devices for converting input electrical power to an intense beam of optical or infrared radiation, but their use is constrained in several ways. The output beam is emitted with different angular spread and different apparent source size in two perpendicular axes, and may need to be reshaped for practical applications. A laser diode also heats its supporting structure when it is used. The damage threshold of a laser diode's output surface limits its maximum power. Many applications, such as welding, surgery, and optical pumping of the active core of a fiber laser are facilitated by various techniques of combining the outputs of a plurality of laser diodes into a single beam, to be input to an optical fiber. In one such technique, each emitted diode laser beam was pre-shaped by an attached microlens and eight separately mounted diodes were provided with lenses and supported in a metal base frame. The beams were then combined by reflection from a polyhedral mirror and brought to a collective focus into an optical fiber. The total beam power provided was 32 Watts.

Efforts to put higher radiant power from a plurality of laser diodes into an optical fiber have continued. In late 2003, a three year program to develop Super-High Efficiency Diode laser Sources (SHEDS), with emphasis on high effective power, small size, light weight, and minimal power wasted as heat was started. Few of the stated program goals have been met, so there is a need for a better technique for combining the output beams from laser diodes.

Two organizations have reported a high-power Fiber-Coupled laser-diode Module (FCM) with 200 W or more output, not yet reaching the SHEDS goals for low Size, Weight, And waste Power (SWAP).

The commercially available Fiber-Coupled laser-diode Module (FCM) with the highest power output into a fiber, still only 200 W, has been sold for more than ten years as the LIMO AV-10 series. It is characterized by a power conversion efficiency of only 31% and a weight of about 8 kilograms.

SUMMARY OF THE INVENTION

Embodiments of the present teachings provide a new KM with much higher power output, significantly lower weight, and more efficient power conversion.

In one or more embodiments, the system of theses teachings includes one or more laser diode optical sources; a laser diode optical source being one of a laser diode or a laser diode bar, and one or more microchannel temperature control components, each one of the one or more microchannel temperature control components being attached to one of the one or more laser diode optical sources, each one microchannel temperature control component configured to substantially minimize electrical current through a fluid coolant, the electrical current being substantially minimized to a level that allows the use of non-de-ionized liquid as a fluid coolant.

Other embodiments are disclosed herein below.

For a better understanding of the present teachings, together with other and further needs thereof, reference is made to the accompanying drawings and detailed description and its scope will be pointed out in the appended claims.

BRIEF DESCRIPTION OF THE FIGURES

FIG. 4a shows Conventional mounting a single LD bar on an MCC;

FIG. 4b shows an Embodiment of Present teachings for mounting a single LD bar on an MCC;

FIGS. 5a-5c show an assembly of these teachings having a Laser Diode bar attached to an individual MCC, showing the water inlet and outlet; The Laser Diode cathode and anode are indicated; A Beam Transformation System (BTS) is attached to the front of the MCC; Components of this assembly are shown in the adjacent exploded view in FIG. 5c;

FIGS. 6a-6e show Side view of a Fiber-Coupled Module (FCM) of these teachings with five Laser Diode bars attached to individual MCCs, showing the paths of the optical beams (white)

DETAILED DESCRIPTION

Figure 1:
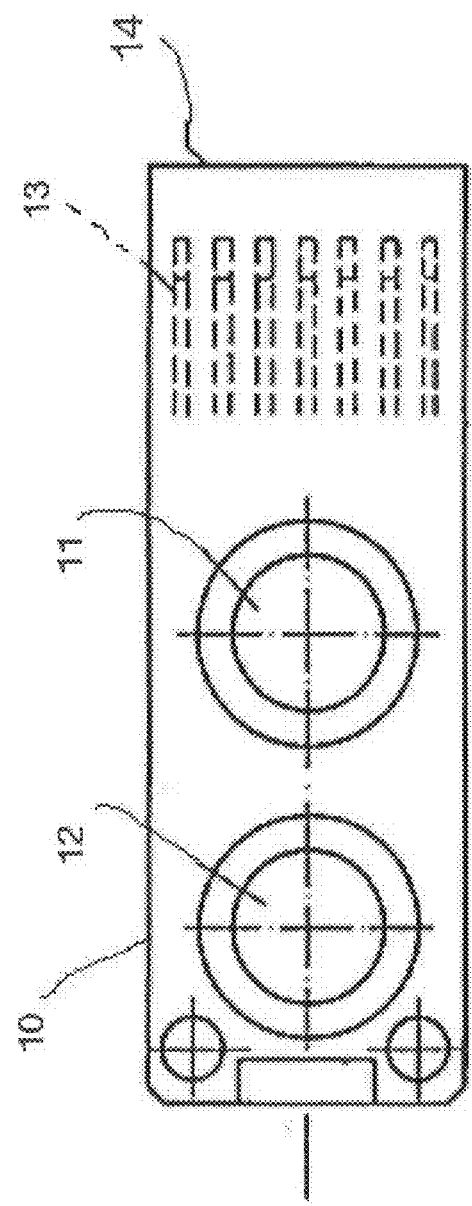
FIG. 1 shows a Top view of a modern Micro Channel Cooler (MCC)

The following detailed description presents the currently contemplated modes of carrying out these teachings. The description is not to be taken in a limiting sense, but is made merely for the purpose of illustrating the general principles of these teachings.

As used herein, the singular forms "a" "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

In order to elucidate the present teachings, the following definitions are provided.

GLOSSARY OF COMMONLY USED ACRONYMS

BTS: Beam Transformation System
DI: De-Ionized (water)
FA: the fast axis (of emission from a Laser Diode)
FCM: Fiber-Coupled laser-diode Module
FWHM: (full width at half-maximum, a measure of optical beam width or divergence)
LD: Laser Diode
LIMO: Lissotsehenko Mikrooptik GmbH (www.limo.de) provides micro-optics
MCC: Micro-Channel Cooler
MMS: Module Mounting Surface
NA: Numerical Aperture
PCE: power conversion efficiency
Pex-fiber: radiant power emerging from an optical fiber
SA: the slow axis (of emission from a Laser Diode)
SHEDS: Super High Efficiency Diode Sources SMAQ: a high-power fiber optic cable with mode stripper
SWAP: reduced Size, Weight, And waste-Power system
VBG: Volume Bragg Grating One embodiment of these teachings achieves a collective laser power of 600 Watts or more injected into a single fiber of 200μ core diameter and 0.22 Numerical Aperture, with unusually high power conversion efficiency, small size, and light weight of the apparatus. One element of these teachings is using a novel microchannel liquid cooling technique in a new way, to remove waste heat more effectively from each laser diode bar. A laser diode bar comprises a plurality of emitting regions. The laser diode bars are individually attached to microchannel cooling plates. A plurality of individually mounted and cooled laser diode bars are then arranged to form a Fiber Coupled Module (FCM), a configuration made feasible by providing each laser diode bar with a microlens Beam Transformation System to reshape its emitted radiation.

The compact and flat structural design of these teachings provides advantages for combining a plurality of the FCMs in a small mounting rack. The FCM apparatus is made mechanically different from previous designs to facilitate replacement of each FCM if it is necessary for maintenance of the combined facility.

One embodiment of the FCM of these teachings is primarily intended to optically pump a multi-kW fiber laser or amplifier. As such, the key design parameters are high ex-fiber power from a small core (200μ) small numerical aperture (NA 0.22) fiber. A single FCM is not expected to supply sufficient optical-power for a laser system emitting multi-100 kWs. In one system configuration, the optical power from multiple FCMs is combined using a tapered fused fiber combiner to pump a multi-kW, fiber laser/amplifier, described in a co-pending application. Subsequently, the optical output of multiple, multi-kW fiber laser/amplifiers is combined to form a multi-100 kW laser system. For such laser systems, the present module is designed for low reduced Size, Weight, And waste-Power system (SWAP) not only to reduce the size and weight of the FCMs themselves, but also the power supply and refrigeration plant required to operate the FCMs.

Although hereinbelow these teachings are disclosed in terms of a laser diode bar, it should be noted that embodiments in which a laser diode is used are also within the scope of these teachings.

In the design of the present teachings, each laser diode bar (LD-bar) is attached to an individual microchannel cooler. In conventional systems, the electrical configuration imposes an electrical bias on a portion of the cooling water within the MCC, causing a current flow. The MCC must then be operated with deionized water (DI), whose electrical conductivity, pH, and oxygen content must be strictly controlled, to prevent electro corrosion. In the present FCM design the electrical configuration is changed to remove any electrical bias on the cooling water within the MCC, to allow the MCC to be operated with distilled water with no control of electrical conductivity, pH, or oxygen content.

A Micro Channel Cooler is designed to remove a large amount of waste heat from a small area, e.g. a high power laser-diode bar, so it has a high thermal conductivity. Copper has been used to fabricate the MCC because it has high thermal conductivity and also high electrical conductivity to carry the large current needed to operate a laser diode bar. Flowing water is generally used as the coolant since water has the highest heat transfer coefficient of common liquids. There have been attempts at replacing copper with a ceramic or water with an inert liquid but both attempts have improved MCC reliability at the expense of performance.

Historically, the LD-bar width was arbitrarily selected to be 10 mm. To form a dense 1D or 2D optical source, the MCC width and thickness are selected to be as small as reasonable, e.g. 11 mm wide and 1 mm thick.

Figure 2:
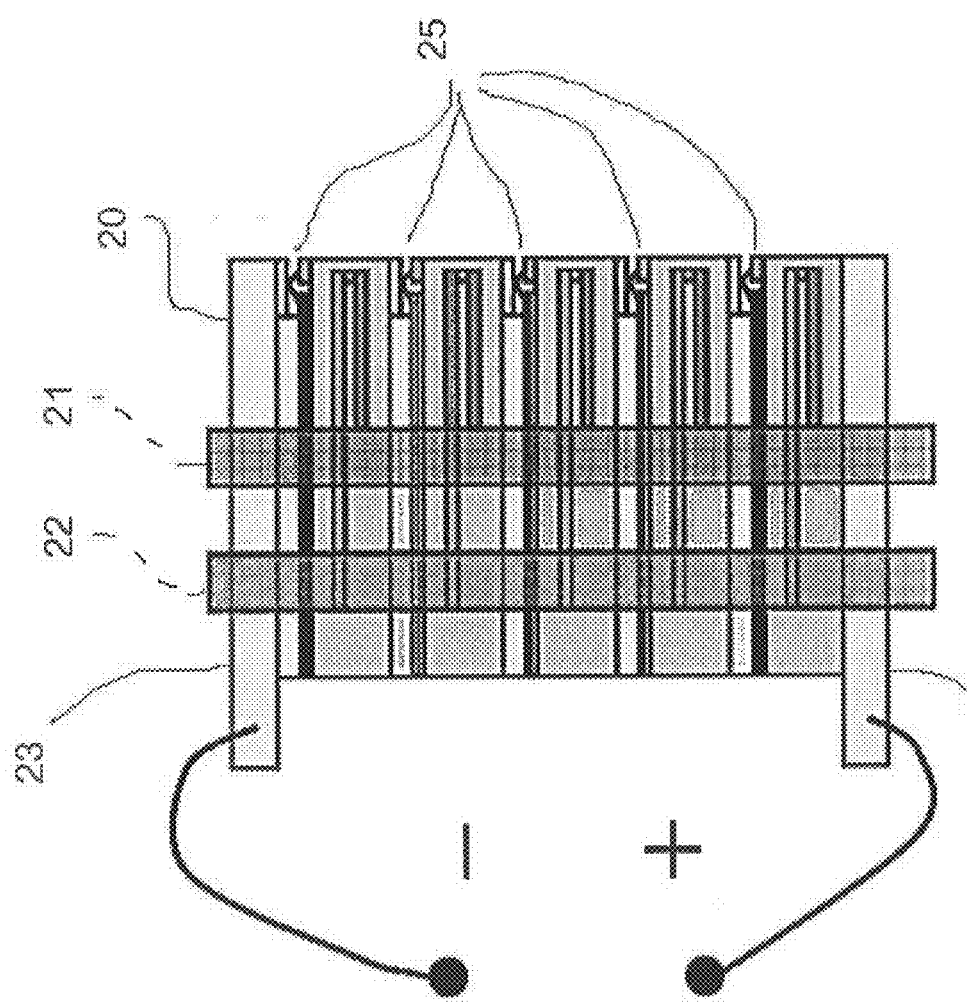
FIG. 2 shows a Side view of a conventional stack of Laser Diode bars on MCCs, indicating internal water flow through the entire stack.

Since the invention of the first MCC for laser diodes in 1991 (see, for example Lapinski et al., U.S. Pat. No. 5,005,640, which is incorporated by reference herein in its entirety and for all purposes), the external form of the MCC has changed little (see, for example Campbell et al., U.S. Pat. No. 7,836,940 and Schulz-Harder et al. U.S. Pat. No. 8,130,807, which are incorporated by reference herein in its entirety and follow purposes). As shown in FIG. 1, it is a hexahedron, or rectangular solid, whose width 14 is about 11 mm. The length is typically 38 mm and the thickness 3 mm or less. There are internal fluid cooling channels 13 near the front end where a Laser Diode is attached. There are a water inlet 11 and water outlet 12 that pass through the MCC, to allow it to be stacked vertically with others as shown in FIG. 2, where 20 is a group of five MCCs with attached Laser Diode bars 25. This form of MCC is used regardless of the number of MCCs within a stack.

Despite its high thermal-conductivity, copper-based Micro-Channel-Coolers are generally avoided in conventional systems. MCCs require the use of de-ionized (DI) water as a coolant to reduce current flow through the coolant along with proper maintenance of coolant electrical-conductivity, pH, and oxygen concentration. As shown in FIG. 2, the coolant water, inlet at 21 and outlet at 22, is in electrical contact with both the laser diode anode 24 and cathode 23. As a result of this electrical bias, a small electrical current flows through the water depending on the electrical conductivity of the water. This current causes electro-corrosion of the copper. DI water has low electrical conductivity to limit the current through the water, which subsequently reduces but does not eliminate the electro-corrosion.

In the present teachings, a copper-based MCC is used that can be operated reliably with distilled water. By proper passivation of the copper surface and fixturing), a LD-bar, directly attached to an MCC, can be operated reliably with distilled water as the coolant. The operation is carefree since no control of water conductivity, pH, or oxygen content is required.

Figure 3:
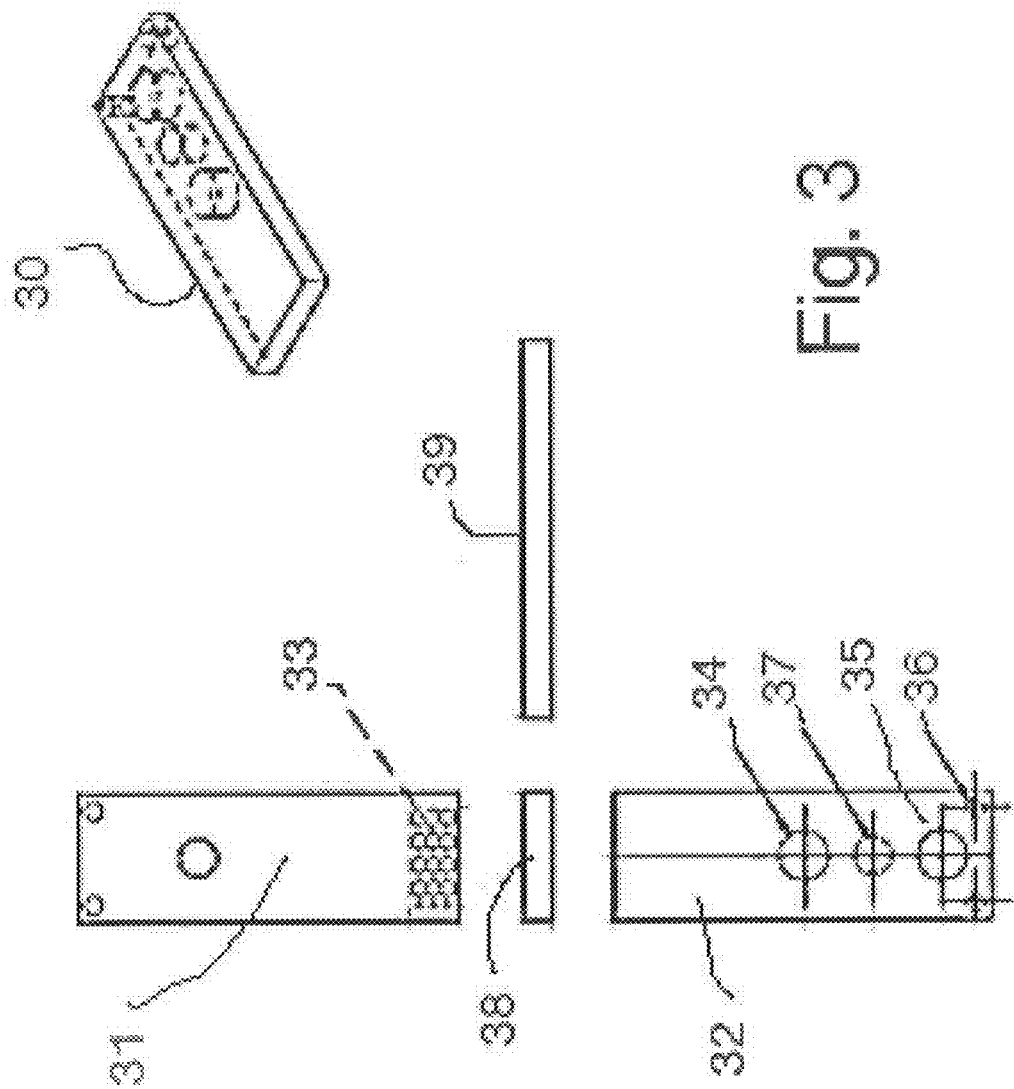
FIG. 3 show a Redesigned MCC of these teachings for single laser diode bar operation.
Figure 6E:
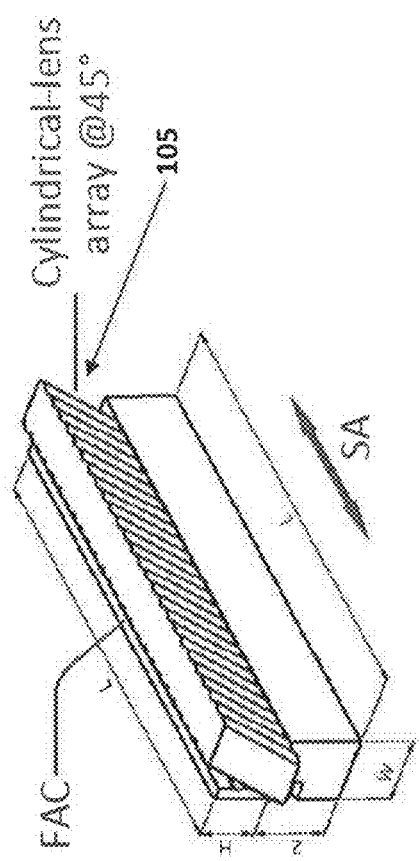
Figure 6D:
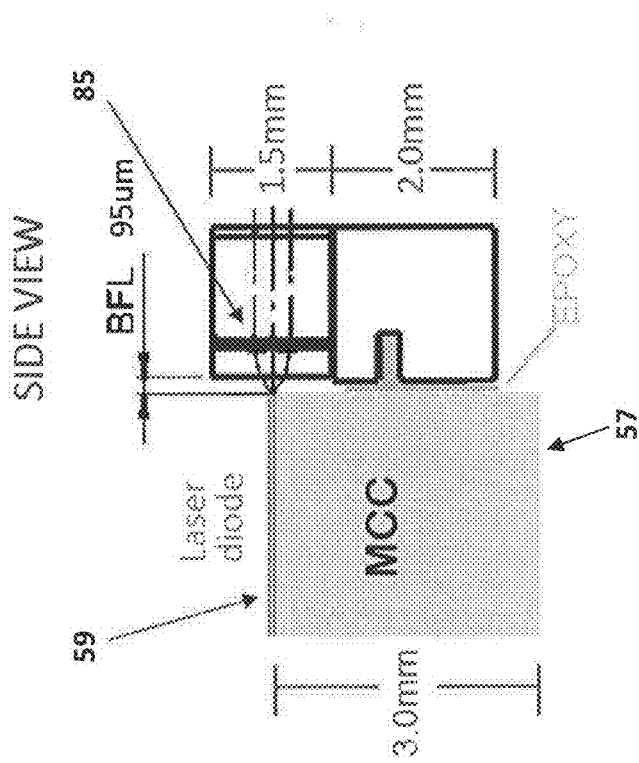

FIG. 3 shows the external configuration of one embodiment of the MCC 30 of these teachings. The top view of the MCC is 31, and the bottom view is 32. The internal fluid channels 33 cool the attached Laser Diode bar. The end view of the MCC is 38, showing that the structure is thin. The water inlet 34 and outlet 35 are sealed on one side since the MCC is not intended to be stacked. Guide holes 36 and through hole 37 are used to define the position of the MCC and attach it to other components.

FIG. 4A shows schematically the conventional packaging a single LD-bar 44 mounted near the front 45 of a MCC 40. Because the packaging components for a single bar are the same as those for a stack, there is an electrical bias; i.e., the forward voltage of the LD-bar, across the cooling water from the cathode 46 to the anode (not shown at the bottom of the assembly) that causes electro-corrosion of the copper cooler.

FIG. 4B shows schematically the packaging of a single LD-bar using one embodiment of the MCC of these teachings depicted in FIG. 3. The cathode is not placed in contact with the water. Because the fluid cannot now contact the cathode 46, current flows through the water are significantly reduced and consequently, distilled water can be used as the coolant without concern for electro-corrosion of the copper. In another instance, a mixture of water and alcohol is used as the coolant.

In one embodiment, the packaging of a single LD-bar using one embodiment of the MCC of these teachings is approximately a hexahedron. The fiber connection for the single LD-bar/MCC module is at one surface of the hexahedron. The electrical connection is at a surface opposite to the surface which has the fiber connection. The water connection is on another one of the side surfaces of the hexahedron. The single LD-bar is directly attached to the cooling surface of the MCC, the cooling surface being substantially flat.

Conventional fiber-coupled modules (FCM) using LD-bars fall into two categories. In one group, the LD-bars, each attached to a MCC, are physically stacked to form a 2D optical array of LD-emitters. MCC are used to achieve high optical powers. In the other group, the LD-bars, each attached to a passive heat sink, are optically stacked to form a 2D optical array of LD emitters. Passive coolers are used to achieve high cooler lifetime and allow the carefree use of distilled water.

The inventors are not aware of a FCM in which the LD-bars, each attached to a MCC, are optically stacked to form a 2D optical array of LD-emitters, an advantage of the present invention.

In many conventional systems, the micro-optics used to collimate the output of the LD-bar consists of a cylindrical lens along the FA followed by a cylindrical lens array along the slow axis. Although less frequent, in some other conventional systems, the optical output of LD-bar, attached to passive heat-sinks is collimated, along the slow axis using a beam-transformation system (BTS) described in Lissotschenko et al., U.S. Pat. No. 6,471,372 B1, which is incorporated by reference herein in its entirety and for all purposes. In these teachings, a fiber-coupled module incorporates single LD-bars attached to individual MCCs. The MCCs are packaged so that they can operate reliably with distilled water as a coolant. The optical output of each LD-bar is collimated along the slow axis with an array of cylindrical micro lenses (LIMO BTS optics) and along the Fast Axis (FA) with a cylindrical lens. The optical outputs of the collimated bars are optically stacked along the fast axis using mirrors.

FIGS. 5a-5c illustrate how the Laser Diode bar and an MCC of these teachings can be packaged for mechanical support, attachment, and cooling. The assembled package 53 is supported by attachment to its bottom surface 64, where fluid coolant is introduced through inlet 61 and removed through outlet 62. The adjacent exploded view shows where Laser Diode bar 59 is attached to Micro Channel Cooler 57. The MCC 57 is mounted between rectangular plate 55 and U-shaped plate 56, together serving as the cathode for supplying electrical power, and the supporting block 60, serving as the electrical anode. Screw holes 67 allow electrical connection to the laser diode cathode. Screw holes 68 allow electrical connection to the laser diode anode.

Mounting holes 63 are used to attach and support this entire assembly. The special Beam Transformation System (BTS) 58 is attached to the front of the MCC to shape the radiant power emitted by the Laser Diode bar.

FIGS. 6a-6e shows an example FCM 80 constructed according to the present teachings. There are five LD bars mounted on their individual MCCs, 53. The optical output of each LD-bar is collimated with a Beam Transformation System (BTS) comprising a cylindrical micro-lens 85 to collimate the beam along the Fast Axis (FA) followed by an array of cylindrical micro-lenses 105 to collimate the beam along the Slow Axis. (SA) The FA and SA micro-lenses are at an angle of about 45° to each other. In contrast, in other conventional systems, the optical output of the LD bars is collimated with conventional micro-optics, consisting of a cylindrical micro-lens to collimate the beam along the fast axis (FA), followed by an array of cylindrical micro-lenses to collimate the beam along the slow axis (SA) in which the FA and SA micro-lenses are orthogonal to each other.

FIGS. 6a-6e also shows how the five individually packaged Laser Diode bars (IPLDB) and MCCs can be attached to a single Module Mounting Surface (MMS) 83. The five individually packaged Laser Diode bars are connected electrically in series to reduce the electrical current required to operate the FCM. The anode 82 and cathode 74 are the electrodes for the FCM. Cathode 74 is electrically connected to the cathode 90; anode 95 is electrically connected to cathode 91 using connector 75; anode 95 is electrically connected to cathode 91 using connector 76; anode 96 is electrically connected to cathode 92 using connector 75; anode 97 is electrically connected to cathode 93 using connector 76; anode 98 is electrically connected to cathode 94 using connector 75; anode 99 is electrically connected to anode 82. Coolant can flow through channels within the Module Mounting Surface (MMS) plate, 83, through attached tubes, or by any other convenient path. The Beam Transformation Systems are shown at 84. The Fast Axis cylindrical collimating lenses are shown at 85, and the beams initially travel upward through them.

Five small Turning Mirrors, 86, attached with glass support blocks 87, redirect the individual collimated light beams, shown in white at 88, toward the right in FIG. 6. In one embodiment, the mirrors have a substantially high reflectivity (>95%) at an emission wavelength of one or more laser diode optical sources. In one instance, the mirrors have a substantially low reflectivity (<20%) in an spectral region of 1050 nm to 1100 nm. This geometry brings the beams closer together as they pass through aperture 89. The individual beams are brought to a common focus by Aspheric Focusing Lens 70, into the SMAQ Connector 71 attached to an output optical fiber of 200µ core diameter and 0.22 Numerical Aperture (NA). The position and angular setting of each small Turning Mirror is very important, so they are preferably held and positioned one at a time while the power delivered to the optical fiber is monitored, then locked into position by UV curing of an epoxy or other polymer cement, or by use of a cooled solder attachment to the MSS plate, or by laser welding attachment to the MSS plate.

Figure 7:
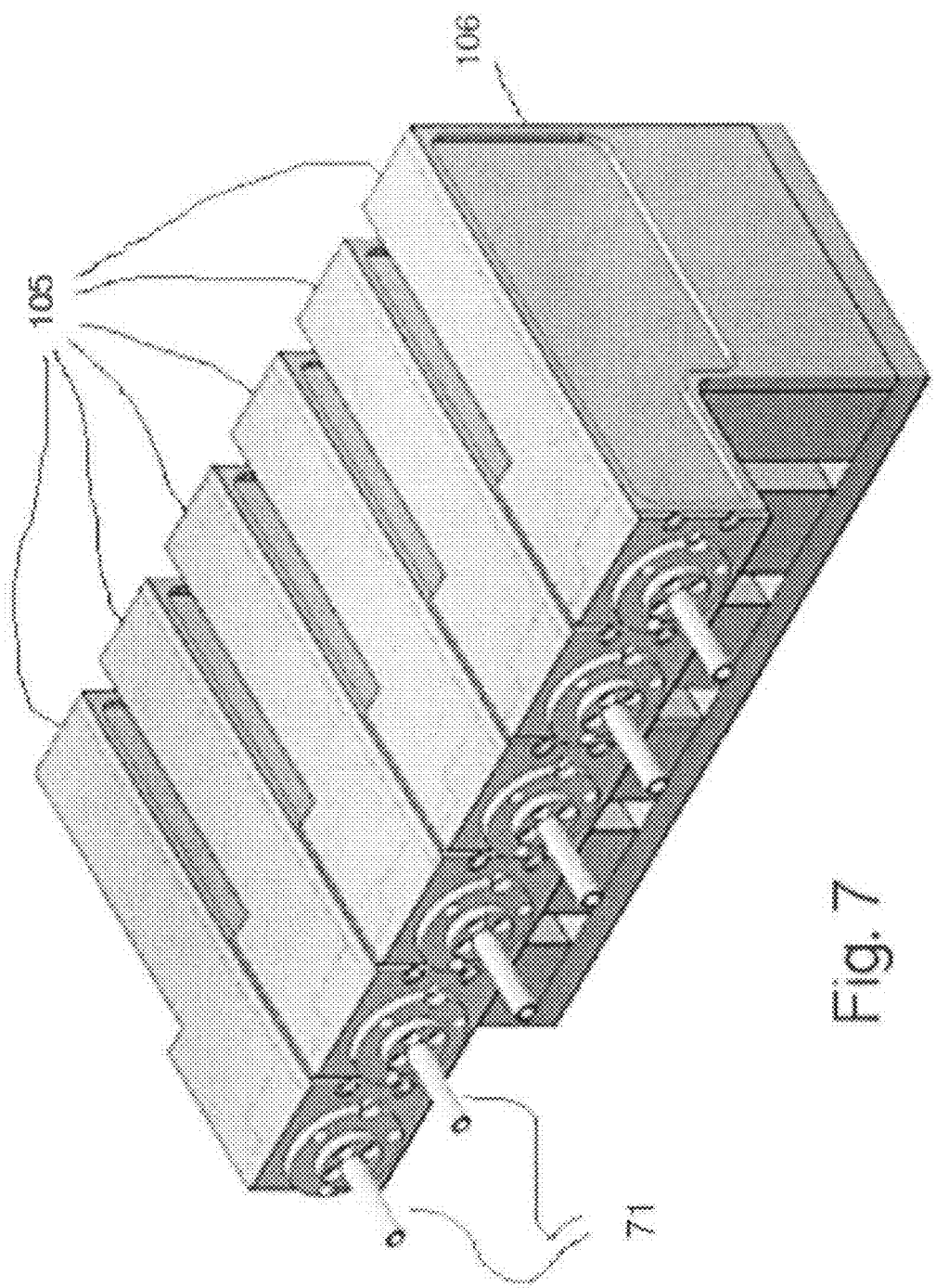
FIG. 7 shows a Horizontal array of six compact Fiber Coupled laser-diode Modules (FCMs).

FIG. 7 Shows how a horizontal array of six compact Fiber Coupled laser-diode Modules (FCMs) 75 can be placed side by side. All electrical connections are preferably made to the back surface of the FCMs, 76 so that an individual Module can be removed and replaced quickly if necessary for maintenance. All fluid connections are preferably made to one of the side surfaces of the FCMs, 76 so that an individual Module can be removed and replaced quickly if necessary for maintenance. The fiber connections 77 are at the front of the group for easy access.

These are some specific features of one embodiment, but details may be altered for advantages in a particular application:
1. One embodiment of the module shape is shown in FIGS. 6a-6e.
2. In that embodiment, the Laser Diode bar is directly attached to the MCC using an indium-based material, as in FIG. 4B. The following statements refer also to that embodiment.
3. The MCC is mainly made of copper for high thermal-conductivity and high electrical conductivity.
4. The MCC has a coolant inlet-port and coolant outlet-port that are sealed on one side (FIG. 3).
5. The MCC thickness is >1.5 mm (for optic attachment)
6. The MCC with its attached LD-bar is placed in an assembly to electrically access the LD bar and to access the coolant ports comprising three pieces: a bottom piece, a U-shaped piece, and a top piece. The bottom piece is the anode. The middle piece and the top piece are the cathode, (FIG. 5)

7. The electrical connection between the top piece and the LD-cathode surface is made with a malleable material, such as indium (FIG. 5).
8. The LD-assembly shown in FIGS. 6a-6e is electrically isolated from the module surfaces,
9. The electrical connections to the LD-bar are made to the back surface of the assembly shown in FIG. 5 for convenience in module construction.
10. The coolant connections to the MCC are located on the bottom surface of the assembly where shown in FIG. 5 for convenience in module construction and to the reduce module size.
11. The LD-assembly in FIG. 5 is mechanically attached to the module mounting surface (MMS) using screws passing through the bottom piece.
12. The coolant for the MCC in FIG. 5 can be distilled water,
13. The coolant for MCC in FIG. 5 can be a mixture of water and alcohol.
14. The path of the optical beams is indicated in FIGS. 6a-6e. Starting at the front surface of each LD-bar, the optical output of the LD-bar is first modified by optics. The BTS mainly collimates the LD beam along the Slow Axis (SA), and is followed by a cylindrical lens to collimate the beam along the Fast Axis (FA). Each beam initially travels upward in FIGS. 6a-6e.

a mode stripper, such as a high-power fiber optic cable with mode stripper (SMAQ).
18. The fiber connector is water cooled.
19. The fiber connector is located on the front surface of the module to allow module stacking as shown in FIG. 7.
20. All electrical access is located on the back surface of the module to allow module stacking as shown in FIG. 7 and convenient replacement if needed.
21. Coolant access is located on one side surface (MMS) of the module to allow module stacking as shown in FIG. 7.
22. The module mounting-surface is the bottom surface as shown in FIG. 7.
23. The maximum width of a module is 1.56" (19"/12) to fit 12 modules onto a standard 19" relay rack.
24. The aperture in FIGS. 6a-6e is water cooled.

Preferably most or all of the metal parts of a module are fabricated of the same alloy to retain optical alignment over a large operating temperature range. But where there are no liquid cooling channels within the large MMS mounting plate, the weight of it may be reduced further by cutting holes in it, or by making it thinner and attaching it in a suitable way to a stiffening component made of granite, glass, or other low-density rigid material.

Table 1 compares the structures of reported prior art Fiber-Coupled laser diode Modules from Optical Engines Inc and from DILAS Diodenlaser GmbH with those of one design of these teachings (labeled SRL).

TABLE 1

| Organization | Vertical stack | Horizontal array | MCC heat-sink | Passive heat-sink | Direct die attach to heat-sink | CTE matched submount | Bar | Mini-bar | Conventional optics | LIMO BTS | DI water coolant | Distilled water coolant |
|---|---|---|---|---|---|---|---|---|---|---|---|---|
| Optical Engines | ✓ | | ✓ | | ✓ | | ✓ | | ✓ | | ✓ | |
| Dilas | | ✓ | | ✓ | ✓ | | ✓ | ✓ | ✓ | | | ✓ |
| SRL | | ✓ | ✓ | | ✓ | | ✓ | | | ✓ | | ✓ |

15. An optical stack is formed using a separate plane mirror for each LD-bar to turn the beam 90° from the original optical axis. The mirrors are staggered so that optical beams from adjacent LD-bars along the FA slightly overlap and have parallel optical axes. The mirrors are attached to the MMS.
16. The wavelength of each LD-bar can be stabilized by placing a plane Volume Bragg Grating (VBG) before or after the cylindrical lens. The reflectivity of the VBG is more than that of the front facet of the LD-bar (typically 0.1% to 5%) and less than ~20% for high LD-bar slope efficiency. The VBG is most conveniently attached to the Module Mounting Surface MMS.
17. The collimated beams from the LD-bars are focused into the input end of the optical fiber using an appropriate Aspherical Focusing Lens. The fiber is attached to the module using a precision fiber-optic connector with Table 2 compares the structure of the prior art LIMO AV-10 series Fiber-Coupled laser diode Modules, available from Lissotschenko Mikrooptik GmbH, with that of the one design of these teachings (labeled SRL). One improvement incorporated in the design of these teachings (labeled SRL) is its effective non-standard use of water cooling close to the laser diode bars where the waste heat is produced.

TABLE 2

| Module | MCC heat-sink | Passive heat-sink | Direct die attach to heat-sink | CTE matched submount | Optical/electrical/coolant access on separate surfaces | Electrical/coolant access on same surface | External coolant distribution system | Integral coolant distribution system |
|---|---|---|---|---|---|---|---|---|
| LIMO AV10 series | | ✓ | | ✓ | | ✓ | | ✓ |
| SRL | ✓ | | ✓ | | ✓ | | ✓ | |

Table 3 compares the performance of the prior art LIMO200-F200-DL9xx-AV10A Fiber Coupled Module with that of the present SRL invention. Three parameters of significant importance to a user are ex-fiber optical power ($P_{ex\text{-}fiber}$), power conversion efficiency (PCB), and the weight. With the changes in Table 2, the present module has three times $P_{ex\text{-}fiber}$, 60% better PCE, and one eighth the weight. A useful figure of merit for a low SWAP module is the optical output divided by the weight. The combinational LIMO design delivers only about 0.025 Watts/gram, but the design of these teachings (labeled SRL) provides 0.6 Watts/gram or better.

TABLE 3

| Module | Fiber core (μm) | Fiber NA | Ex-fiber power (W) | Number of LD-bars | Power conversion efficiency (%) | Coolant flow (LPM) | Weight (kg) |
|---|---|---|---|---|---|---|---|
| LIMO200-F200-DL9xx-AV10-A | 200 | 0.22 | 200 | 6 | 31 | 5 | <8 |
| SRL | 200 | 0.22 | 600 | 5 | >50 | <2 | <1 |

For the purposes of describing and defining the present teachings, it is noted that the term "substantially" is utilized herein to represent the inherent degree of uncertainty that may be attributed to any quantitative comparison, value, measurement, or other representation.

The term "substantially" is also utilized herein to represent the degree by which a quantitative representation may vary from a stated reference without resulting in a change in the basic function of the subject matter at issue.

Although these teachings have been described with respect to various embodiments, it should be realized these teachings is also capable of a wide variety of further and other embodiments within the spirit and scope of the claims.

What is claimed is:

1. An apparatus comprising:
one or more laser diode optical sources; a laser diode optical source being one of a laser diode or a laser diode bar;
one or more microchannel temperature control components, each one of the one or more microchannel temperature control components being attached to one of the one or more laser diode optical sources; said each one microchannel temperature control component configured to substantially minimize electrical current through a fluid coolant, said electrical current being substantially minimized to a level that allows the use of non-de-ionized liquid as the fluid coolant; a cathode of the one or more laser diode optical sources being electrically isolated from the fluid coolant; and
an optical system configured to optically couple electromagnetic radiation emitted from the one or more laser diode optical sources into an optical fiber;
the optical system comprising:
one or more optical subsystems, each one optical subsystem from the one or more optical subsystems collimating electromagnetic radiation emitted from one of the one or more laser diode optical sources; said each one optical subsystem comprising:
a cylindrical lens disposed to receive said electromagnetic radiation emitted from said one of the one or more laser diode optical sources; the cylindrical lens configured to substantially collimate said electromagnetic radiation along a fast axis; and
an array of cylindrical lenses; at least one cylindrical lens from said array of cylindrical lenses being optically disposed to receive electromagnetic radiation output from said cylindrical lens; said at least one cylindrical lens from said array of cylindrical lenses being disposed to substantially collimate said electromagnetic radiation output along a slow axis; a cylinder axis of each cylindrical lens from said array of cylindrical lenses being disposed at an angle of about 45° with respect a base of said array of cylindrical lenses.

2. The apparatus of claim 1 further comprising one or more redirecting optical components, each one of the one or more redirecting optical components disposed to receive substantially collimated electromagnetic radiation output from said each one optical subsystem and providing redirected substantially collimated electromagnetic radiation.

3. The apparatus of claim 2 wherein a combined electromagnetic radiation output of the apparatus has a power of at least 500 W.

4. The apparatus of claim 2 further comprising an Aspheric focusing lens optically disposed to receive said redirected substantially collimated electromagnetic radiation and configured to substantially focus said substantially collimated electromagnetic radiation onto a connector attached to said optical fiber.

5. The apparatus of claim 2 wherein said one or more redirecting optical components comprise mirrors disposed to redirect electromagnetic radiation by approximately 90° from an input optical path.

6. The apparatus of claim 5 wherein said mirrors have a substantially high reflectivity at an emission wavelength of said one or more laser diode optical sources.

7. The apparatus of claim 6 wherein said mirrors have a substantially low reflectivity in and spectral region of 1050 am to 1100 nm.

8. The apparatus of claim 1 further comprising a single module mounting surface of a module mounting plate on which the one or more laser diode optical sources, the one or more microchannel temperature control components and one or more optical subsystems are disposed on.

9. The apparatus of claim 8 further comprising a stiffening component; said module mounting plate being disposed on the stiffening component.

10. The apparatus of claim 9 wherein said stiffening component comprises at least one light weight nonmetallic component; said light weight nonmetallic component having a density of less than 3 g per cubic centimeter.

11. The apparatus of claim 1 wherein said one or more microchannel temperature control components comprise copper components.

12. The apparatus of claim 1 wherein said fluid coolant is at least one of distilled water or an alcohol and water mixture.

* * * * *